(12) United States Patent
El-Khamy et al.

(10) Patent No.: US 10,657,364 B2
(45) Date of Patent: May 19, 2020

(54) SYSTEM AND METHOD FOR DEEP NETWORK FUSION FOR FAST AND ROBUST OBJECT DETECTION

(71) Applicant: Samsung Electronics Co., Ltd., Gyeonggi-do (KR)

(72) Inventors: Mostafa El-Khamy, San Diego, CA (US); Xianzhi Du, College Park, MD (US); Jungwon Lee, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 117 days.

(21) Appl. No.: 15/434,880

(22) Filed: Feb. 16, 2017

(65) Prior Publication Data

US 2018/0089505 A1 Mar. 29, 2018

Related U.S. Application Data

(60) Provisional application No. 62/399,046, filed on Sep. 23, 2016.

(51) Int. Cl.
| | |
|---|---|
| *G06K 9/00* | (2006.01) |
| *G06N 3/04* | (2006.01) |
| *G06T 7/73* | (2017.01) |
| *G06T 7/11* | (2017.01) |
| *G06K 9/62* | (2006.01) |
| *G06K 9/78* | (2006.01) |
| *G06N 3/08* | (2006.01) |

(Continued)

(52) U.S. Cl.
CPC ....... *G06K 9/00369* (2013.01); *G06K 9/6256* (2013.01); *G06K 9/6277* (2013.01); *G06K 9/78* (2013.01); *G06N 3/0454* (2013.01); *G06N 3/08* (2013.01); *G06N 7/005* (2013.01); *G06T 7/11* (2017.01); *G06T 7/73* (2017.01); *H01L 27/146* (2013.01); *H01L 27/14683* (2013.01); *G06F 30/392* (2020.01); *G06F 30/398* (2020.01); *G06T 2207/10004* (2013.01); *G06T 2207/20081* (2013.01); *G06T 2207/20084* (2013.01); *G06T 2207/30196* (2013.01); *G06T 2210/12* (2013.01)

(58) Field of Classification Search
CPC ............. G06T 7/0014; G06T 7/136; G06T 2207/20221; G06T 5/50
See application file for complete search history.

(56) References Cited

U.S. PATENT DOCUMENTS 6,754,390 B2 6/2004 Dobeck
6,856,708 B1 * 2/2005 Aoki ............... H04N 5/208
345/629

(Continued)

OTHER PUBLICATIONS

McCloskey, Scott; et al., Metadata-weighted Score Fusion for Multimedia Event Detection, Jan. 2014 Canadian Conference on Computer and Robot Vision (CRV), May 9, 2014, pp. 7.*

*Primary Examiner* — Yosef Kassa
(74) *Attorney, Agent, or Firm* — The Farrell Law Firm, P.C.

(57) ABSTRACT

A method and apparatus are provided. The method includes receiving an image, detecting an object in the image, determining, by a primary object detector, a primary confidence detection score of the object, determining, by a classification network, a confidence scaling factor of the object, and adjusting the primary confidence detection score based on multiplying the primary confidence detection score by the confidence scaling factor.

24 Claims, 8 Drawing Sheets

(51) Int. Cl.
*G06N 7/00* (2006.01)
*H01L 27/146* (2006.01)
*G06F 30/392* (2020.01)
*G06F 30/398* (2020.01)

(56) References Cited

U.S. PATENT DOCUMENTS

| | | | | |
|---|---|---|---|---|
| 6,919,892 | B1* | 7/2005 | Cheiky | G06T 13/40 |
| | | | | 345/473 |
| 7,133,083 | B2* | 11/2006 | Jaynes | G03B 21/26 |
| | | | | 348/745 |
| 7,274,830 | B2* | 9/2007 | Bacarella | H04N 5/2624 |
| | | | | 348/E5.053 |
| 7,308,139 | B2* | 12/2007 | Wentland | G01V 1/34 |
| | | | | 382/181 |
| 7,634,142 | B1 | 12/2009 | Bourdev et al. | |
| 8,165,408 | B2 | 4/2012 | Fukaya et al. | |
| 8,543,573 | B2* | 9/2013 | MacPherson | G06T 11/206 |
| | | | | 707/736 |
| 8,768,104 | B2* | 7/2014 | Moses | G06F 9/5072 |
| | | | | 382/100 |
| 8,965,115 | B1 | 2/2015 | Khosla et al. | |
| 9,100,572 | B2 | 8/2015 | Rodriguez-Serrano et al. | |
| 9,104,914 | B1 | 8/2015 | Vincent et al. | |
| 9,183,459 | B1* | 11/2015 | Zhang | G06K 9/52 |
| 9,260,122 | B2 | 2/2016 | Haas et al. | |
| 2015/0170002 | A1* | 6/2015 | Szegedy | G06K 9/66 |
| | | | | 382/156 |
| 2015/0363643 | A1 | 12/2015 | Huber et al. | |
| 2017/0039457 | A1* | 2/2017 | Yu | G06K 9/6201 |

* cited by examiner

SYSTEM AND METHOD FOR DEEP NETWORK FUSION FOR FAST AND ROBUST OBJECT DETECTION

PRIORITY

This application claims priority under 35 U.S.C. § 119(e) to U.S. Provisional Patent Application No. 62/399,046 which was filed in the U.S. Patent and Trademark Office on Sep. 23, 2016, the entire content of which is incorporated herein by reference.

FIELD

The present disclosure generally relates to deep neural networks, and more particularly, to a system and method for deep network fusion for fast and robust object detection.

BACKGROUND

Object recognition, such as face recognition, includes identifying a person from a database of images captured by an image sensor such as a camera and typically includes learning a facial image. The representation of the captured image is compared with the representation of facial images in the database using a metric to return a closest match. Face recognition includes pre-processing steps such as face detection and face alignment.

Object recognition within a visual image captured by a camera, may be utilized in a variety of industries or applications, including defense, transportation or law enforcement, among others. For example, it may be desirable to identify one or more objects such as a car, a pedestrian, and a building, within an image. Conventional object detection approaches may not provide a desired reliability in accurately identifying target objects and/or may provide a greater than desired number of false positive identifications (e.g., detecting a non-target object as a target object.)

Pedestrian detection in an image currently plays an essential role in various aspects of video surveillance, person identification, and advanced driver assistance systems (ADAS). Real-time, accurate detection of pedestrians is important for practical adoption of such systems. A pedestrian detection method aims to draw bounding boxes that precisely describe the locations of all pedestrians in an image, in real-time processing speed.

SUMMARY

An aspect of the present disclosure provides a system and method that includes a deep neural network fusion architecture for fast and robust detection of pedestrians captured in an image.

According to an aspect of the present disclosure, a method is provided which includes receiving an image, detecting an object in the image, determining, by a primary object detector, a primary confidence detection score of the object, determining, by a classification network, a confidence scaling factor of the object, and adjusting the primary confidence detection score based on multiplying the primary confidence detection score by the confidence scaling factor.

According to another aspect of the present disclosure, an apparatus is provided which includes an image sensor, a primary object detector, a classification network, and a processor configured to capture an image from the image sensor, detect an object in the image, determine a primary confidence detection score of the object using the primary object detector, determine a confidence scaling factor of the object using the classification network, and adjust the primary confidence detection score based on multiplying the primary confidence detection score by the confidence scaling factor.

According to another aspect of the present disclosure, a method of manufacturing a processor is provided which includes forming the processor as part of a wafer or package that includes at least one other processor, wherein the processor is configured to capture an image from an image sensor, detect an object in the image, determine a primary confidence detection score of the object using a primary object detector, determine a confidence scaling factor of the object using a classification network, adjust the primary confidence detection score based on multiplying the primary confidence detection score by the confidence scaling factor.

According to another aspect of the present disclosure, a method of constructing an integrated circuit is provided, which includes generating a mask layout for a set of features for a layer of the integrated circuit, wherein the mask layout includes standard cell library macros for one or more circuit features that include a processor configured to capture an image from a image sensor, detect an object in the image, determine a primary confidence detection score of the object using a primary object detector, determine a confidence scaling factor of the object using a classification network, adjust the primary confidence detection score based on multiplying the primary confidence detection score by the confidence scaling factor.

BRIEF DESCRIPTION OF THE DRAWINGS

The above and other aspects, features and advantages of the present disclosure will become more apparent from the following detailed description, when taken in conjunction with the accompanying drawings, in which.

DETAILED DESCRIPTION

The present disclosure will now be described more fully hereinafter with reference to the accompanying drawings, in which embodiments of the present disclosure are shown. This disclosure may, however, be embodied in many different forms and should not be construed as limited to the embodiments set forth herein. Rather, these embodiments are provided so that this disclosure will be thorough and complete, and will fully convey the scope of the device and method to those skilled in the art. Like reference numbers refer to like elements throughout.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes, but is not limited to, any and all combinations of one or more of the associated listed items.

It will be understood that, although the terms first, second, and other terms may be used herein to describe various elements, these elements should not be limited by these terms. These terms are only used to distinguish one element from another. For example, a first signal may be referred to as a second signal, and similarly, a second signal may be referred to as a first signal without departing from the teachings of the disclosure.

The terminology used herein is for the purpose of describing particular embodiments only and is not intended to limit the present device and method. As used herein, the singular forms "a", "an" and "the" are intended to include the plural forms as well, unless the context clearly indicates otherwise. It will be further understood that the terms "comprises" and/or "comprising," or "includes, but is not limited to" and/or "including, but not limited to" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including, but not limited to technical and scientific terms) used herein have the same meanings as commonly understood by one of ordinary skill in the art to which the present device and method belongs. It will be further understood that terms, such as those defined in commonly used dictionaries, should be interpreted as having meanings that are consistent with their meaning in the context of the relevant art and/or the present description, and will not be interpreted in an idealized or overly formal sense unless expressly so defined herein.

Figure 1:
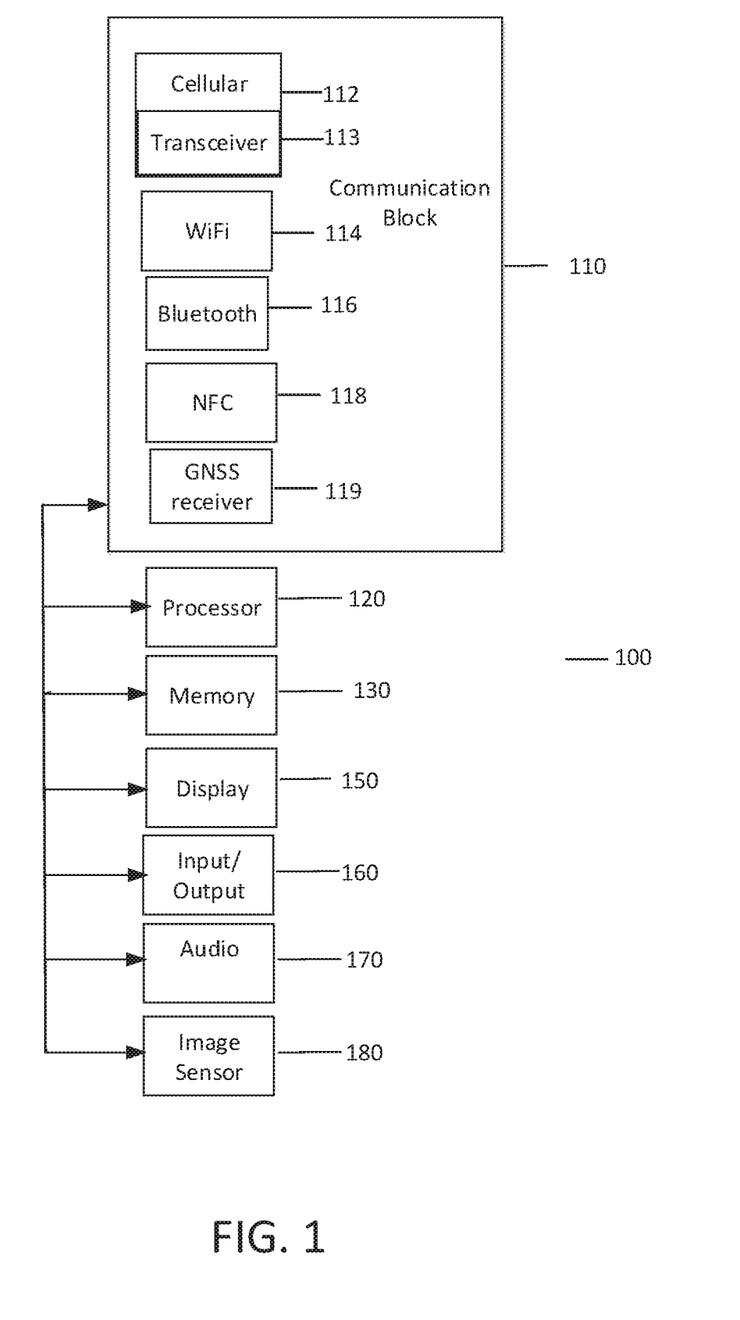
FIG. 1 illustrates a block diagram of an electronic device in a communication network, according to an embodiment of the present disclosure.

FIG. 1 illustrates a block diagram of an electronic device in a network environment, according to an embodiment of the present disclosure.

Referring to FIG. 1, an electronic device 100 includes, but is not limited to, a communication block 110, a processor 120, a memory 130, a display 150, an input/output block 160, an audio block 170 and an image sensor 180. The electronic device 100 may be included in a portable electronic device including, but not limited to a smartphone, tablet or personal computer. The electronic device 100 may also be included in a vehicle, including but not limited to an automobile, a train, an airplane, an autonomous vehicle, a drone, a bicycle and a motorcycle.

The electronic device 100 includes a communication block 110 for connecting the electronic device 100 to another electronic device or a network for communication of voice and data. The communication block 110 provides GPRS, EDGE, cellular, wide area, local area, personal area, near field, device to device (D2D), machine to machine (M2M), satellite, enhanced mobile broad band (eMBB), massive machine type communication (mMTC), ultra-reliable low latency communication (URLLC), narrowband Internet of things (NB-IoT) and short range communications. The functions of the communication block 110, or a portion thereof including a transceiver 113, may be implemented by a chipset. In particular, the cellular communications block 112 provides a wide area network connection through terrestrial base transceiver stations or directly to other electronic devices, using technologies such second generation (2G), GPRS, EDGE, D2D, M2M, long term evolution (LTE), fifth generation (5G), long term evolution advanced (LTE-A), code division multiple access (CDMA), wideband code division multiple access (WCDMA), universal mobile telecommunications system (UMTS), wireless broadband (WiBro), and global system for mobile communication (GSM). The cellular communications block 112 includes, but is not limited to, a chipset and the transceiver 113. The transceiver 113 includes, but is not limited to, a transmitter and a receiver. The wireless fidelity (WiFi) communications block 114 provides a local area network connection through network access points using technologies such as IEEE 802.11. The Bluetooth communications block 116 provides personal area direct and networked communications using technologies such as IEEE 802.15. The near field communications (NFC) block 118 provides point to point short range communications using standards such as ISO/IEC 14443. The communication block 110 also includes a GNSS receiver 119. The GNSS receiver 119 may support receiving signals from a satellite transmitter.

The electronic device 100 may receive electrical power for operating the functional blocks from a power supply, including, but not limited to a battery.

The processor 120 provides application layer processing functions of the electronic device 100. The processor 120 also provides command and control functionality for the various blocks in the electronic device 100. The processor 120 provides for updating control functions required by the functional blocks. The processor 120 may provide resources required by the image sensor 180, a primary object detector, a secondary object detector, a semantic segmentation unit, a fusion center, and a classification network. The classification network may provide both classification and localization.

The memory 130 provides storage for device control program code, user data storage, application code and data storage. The memory 130 may provide data storage for the firmware, libraries, databases, lookup tables, algorithms, methods, and calibration data required by the cellular communications block 112. The memory 130 may provide storage for the images captured by the image sensor 180. The program code and databases required by the image sensor 180 may be loaded into local storage within the image sensor 180 from the memory 130 upon device boot up.

The display 150 may be a touch panel, and may be embodied as a liquid crystal display (LCD), organic light emitting diode (OLED) display, active matrix OLED (AMOLED) display, and the like. The input/output block 160 controls the interface to the user of the electronic device 100. The audio block 170 provides for audio input and output to/from the electronic device 100.

The image sensor 180 may capture both still and moving images. The image sensor 180 may capture images within the visible spectrum portion of the electromagnetic spectrum that is visible to the human eye. The image sensor 180 may also capture images outside the visible spectrum portion of the electromagnetic spectrum including infrared and ultraviolet. The image sensor 180 may be of a complementary metal oxide semiconductor (CMOS) type or a semiconductor charge coupled device (CCD) type and may include an image focusing lens and an image zoom function. The image sensor 180 may also include a memory, a local processor, and an interface to processor 120.

According to an embodiment of the present disclosure, the present system and method includes a deep neural network fusion architecture for fast and robust detection of pedestrians within images captured by the image sensor 180. The deep neural network fusion architecture of the present disclosure includes parallel processing of multiple networks to decrease latency in determining the presence of pedestrians in the captured images. In addition to the deep neural network, the present disclosure includes a deep convolutional network. A single shot (a one step network on a single scale of a single captured image) deep convolutional network is trained as an object detector to generate all possible pedestrian candidates of different sizes and occlusions within the captured image. The deep convolutional network may output a large number and variety of pedestrian candidates within the captured image to cover the majority of ground-truth pedestrians while potentially introducing false positives. Multiple deep neural networks (DNN), which may be considered secondary networks, are further processed in parallel for classification of all pedestrian candidates generated by the deep convolutional network. The secondary networks may further refine the bounding box localization of the primary bounding box candidates. A bounding box is a group of pixels within an area of the captured image which may be defined by a parallelogram having a certain size and aspect ratio (ratio of width to height); however, the bounding box may be a shape other than a parallelogram.

According to an embodiment of the present disclosure, the present system and method provides soft rejection fusion to fuse (combine) the soft metrics generated by the deep convolutional and neural networks together to generate a final confidence score. The final confidence score is a measure of the probability that a detected pedestrian candidate in the image is an actual pedestrian. The present soft rejection fusion system and method fuses secondary detector results (optionally) with primary object detector results and results from the classification network. The present system and method is beneficial for detecting small-size pedestrians and occluded pedestrians within the captured image. The fusion center may further fuse the localization adjustment of the bounding box from all classification networks with the bounding box localization from the primary object detector in order to increase the accuracy of the bounding box localization.

According to an embodiment of the present disclosure, the present system and method integrates pixel-wise semantic segmentation in the fusion network architecture as a reinforcement to the pedestrian detector. The semantic segmentation may partition the image into semantically meaningful parts, and classify each part into one of pre-determined classes. Pixel-wise semantic segmentation may achieve the same goal by classifying each pixel (rather than the entire image/segment). The present system and method is applicable to any evaluation protocol, and provides a performance increase to several evaluation protocols, including significantly higher speed, accuracy, and efficiency. An evaluation protocol may include object detection of a single object such as a pedestrian, or detection of multiple objects such as pedestrians, cars, and cyclists. Evaluation protocols focus on maximizing the accuracy of output detections, while avoiding missing true detections and eliminating false detections.

According to an embodiment of the present disclosure, the present system and method provides network fusion which may be referred to as soft-rejection based network fusion. The soft-rejection based network fusion may refine the candidate objects provided by the primary object detector. Rather than performing a binary classification decision, which either accepts or rejects candidate objects, the classification scores provided by the primary object detection candidates are increased or decreased based on the aggregate degree of confidence in those object detections provided by the classification networks.

The confidence scores of the primary object detection candidates are scaled up or down (increased or decreased) by a confidence scaling factor based on the classification probabilities provided by each classification network. A lower bound is set to the confidence scaling factor to prevent any classification network from dominating the scaling process and prevent elimination of a primary object detection candidate based on a confidence score from a single classification network. The lower bounding process has the effect of reducing the false positive rate while increasing the true object detection rate based on the aggregate confidence of the classification networks. The confidence scaling factors are fused together to produce the final confidence score for each candidate object.

According to an embodiment of the present disclosure, the present system and method utilizes pixel-wise semantic segmentation labeling as a secondary parallel detector and integrates the secondary parallel detector into the present network fusion architecture. The secondary parallel detector based on pixel-wise semantic segmentation labeling acts as a reinforcement to the pedestrian detector (or general object detector). The segmentation labeling consists of labeling each object in the captured image with the category of the object (for example, a pedestrian, car, or building). A soft confidence score may be determined by determining the ratio of overlap between the pixel-wise semantic segmentation labeling and the bounding box detections provided by the primary object detector.

Figure 2:
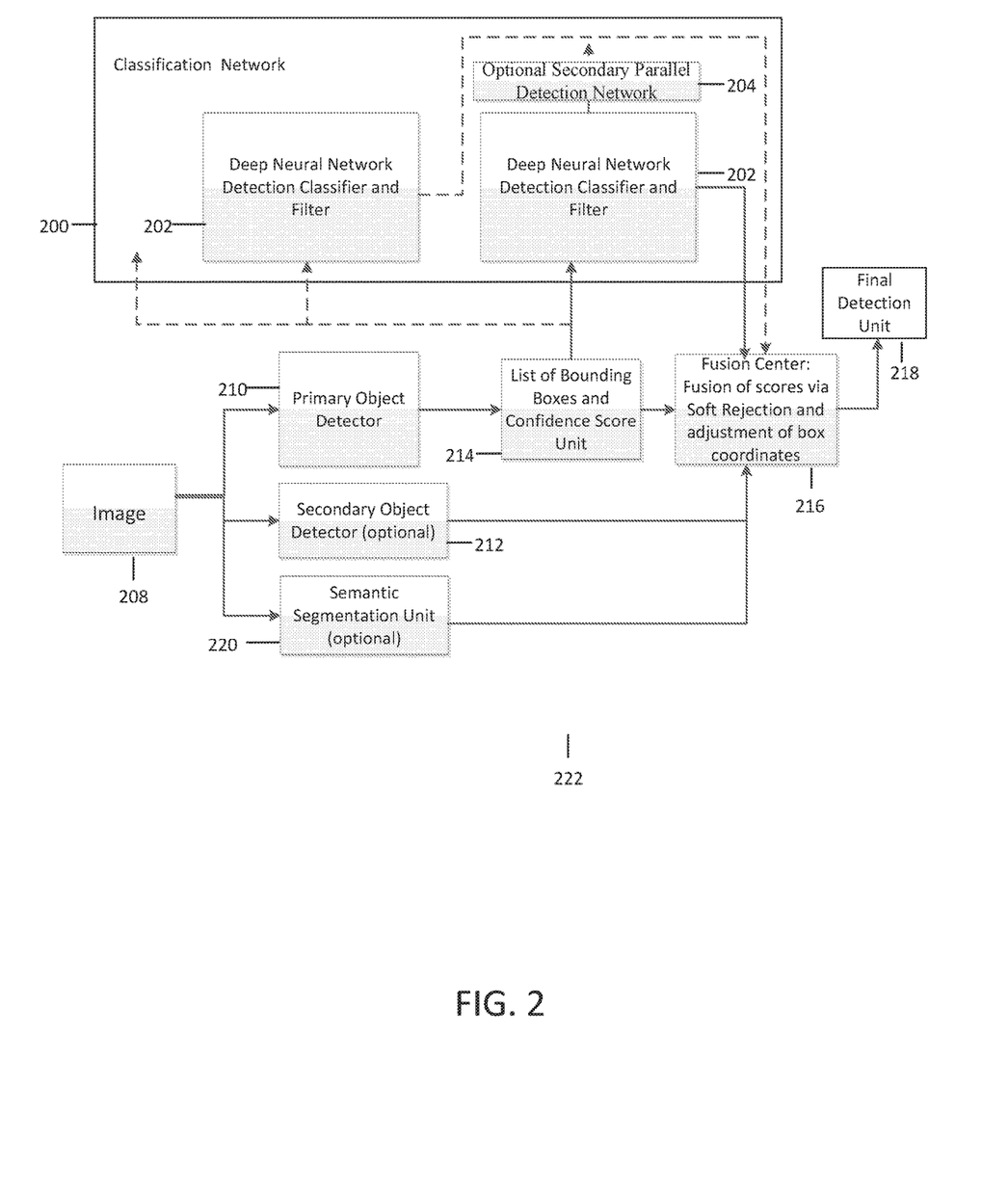
FIG. 2 illustrates a block diagram of a network fusion architecture, according to an embodiment of the present disclosure.

FIG. 2 illustrates a block diagram of the present network fusion architecture, according to an embodiment of the present disclosure.

Referring to FIG. 2, the network fusion architecture 222 includes an image 208 with optional scaling from an image sensor that is provided to a primary objector detector 210 and optionally to a secondary object detector 212 and a semantic segmentation unit 220. The primary object detector 210 determines the objects detected in the image 208 and creates bounding boxes for each of the detected objects. A list of the bounding boxes for the determined objects and their respective confidence scores is created in a list of bounding boxes and confidence scores unit 214. A classification network 200 includes one or more DNN detection classifiers and filters 202. Although FIG. 2 shows two DNN detection classifiers and filters 202, the present disclosure may include any number of DNN detection classifiers and filters without deviating from the scope of the present disclosure. The classification network 200 includes an optional secondary parallel detection network 204. The optional secondary parallel detection network 204 may use deep dilated convolutions and context aggregation for semantic segmentation labeling to further determine a soft confidence score on the primary object detections. A deep dilated convolution uses convolutional kernels with different dilation (upsampling) factors by inserting zeros between the non-zero filter coefficients, effectively increasing the filter's receptive field. A fusion center 216 fuses the results from the one or more DNN detection classifiers and filters 202, the optional secondary parallel detection network 204, the list of bounding boxes and confidence scores unit 214 and optionally the secondary object detector 212 and the semantic segmentation unit 220. The fusion center 216 provides the results of the fusion process to a final detection unit 218 for final determination of the boundary boxes associated with the detected objects.

Figure 3:
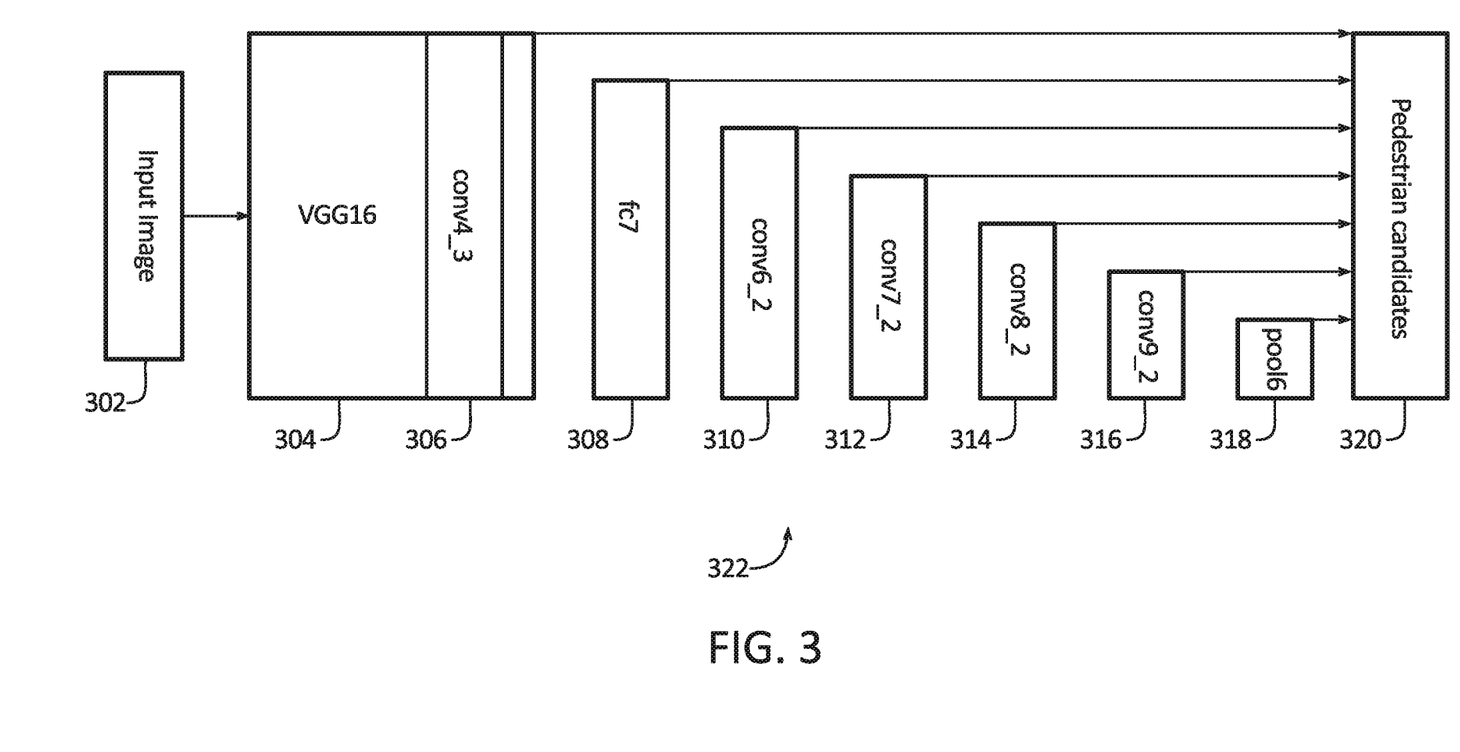
FIG. 3 illustrates a block diagram of a primary object detector using a single shot multi-box detector, according to an embodiment of the present disclosure.

FIG. 3 illustrates a block diagram of a primary object detector using a single shot multi-box detector, according to an embodiment of the present disclosure.

Referring to FIG. 3, seven output layers are used to generate pedestrian candidates within a single captured image. Although FIG. 3 shows seven layers, the present disclosure may include any number of layers without deviating from the scope of the present disclosure. According to an embodiment of the present disclosure, the primary object detector 322 of FIG. 3 includes a feed-forward convolutional network. The input image 302, captured by an image sensor, is provided to a truncated visual geometry group VGG16 304 as the base network. VGG is a convolutional neural network model which includes 16 weight layers having thirteen convolutional layers with filter size of three by three and three fully connected layers. In the VGG16 304 base network layer, the last pool layer 318 is converted to a receptive field size of 3×3 with a stride width of one, and fully connected fc7 is converted to a convolutional layer with a stationary wavelet transform algorithm. The pool layers consolidate the features learned and expressed in the previous layers feature map and may compress or generalize feature representations and generally reduce the overfitting of the training data. Six additional convolutional layers and a global average pooling layer are added after the base network and the size of each layer decreases progressively. Layers conv4_3 306, fc7 308, conv6_2 310, conv7_2 312, conv8_2 314, conv9_2 316 and pool6 318 are used as the output layers. Bounding box regression and classification are performed after each output layer. The pedestrian candidates from the captured image are determined in layer 320.

According to an embodiment of the present disclosure, a primary object detector includes a feed forward convolutional network with features extracted at multiple convolutional scales and resolutions. Bounding box candidates of different sizes and aspect ratios at each location of the extracted features are further classified as an object or background in the captured image, and localization offsets of the candidate bounding boxes are calculated by bounding box regressions. For each output layer of size m×n×p, a set of default bounding boxes in different scales and aspect ratios are placed at each location. The aspect ratios of the default bounding boxes are adjusted to match the objects to be detected, for example the aspect ratio is set to 0.41 if the goal is to detect pedestrians. 3×3×p convolutional kernels are applied to each location to produce classification scores and bounding box location offsets with respect to the default bounding box locations. A default bounding box is labeled as positive if it has a Jaccard overlap index greater than 0.5 with any ground truth box, otherwise the default bounding box is labeled negative. The Jaccard overlap index is used for comparing the similarity of the default bounding box and the ground truth box and is the size of the intersection divided by the size of the union of the data set.

The training objective L of the classification networks 200 may be given as follows in Equation (1) below:

$$L = \frac{1}{N}(L_{conf} + \alpha L_{loc}) \tag{1}$$

where $L_{conf}$ is the softmax classification loss and $L_{loc}$ is a smooth localization loss using a distance metric, N is the number of default boxes labeled as positive, and α is a constant weight term to keep a balance between the two losses. The smooth localization loss may be expressed by the L1 norm of difference between coordinates as L1=Sum |y_i−y'_i|+Sum |x_i−x'_i|, where (x_i, y_i) represents the coordinates of the boxes and (x'_i, y'_j) represents the coordinates of the ground truth boxes, and the sum is over all coordinates.

The training objective of the classification networks 200 is given as the weighted sum of the softmax classification loss and the smooth L1 localization loss. The primary object detector 210 is trained to generate a large pool of candidate objects with the goal of detecting all objects of interest in the captured image (such as pedestrians), even if a large number of false object detections are introduced. Each object detection is associated with its localization bounding box coordinates and a confidence score. By lowering the confidence score threshold above which a candidate object is accepted, candidate objects of various sizes and occlusions are generated from the primary object detector 210.

According to one embodiment, the classification network 200 includes multiple DNN detection classifiers and filters 202 that operate in parallel. Each DNN detection classifier and filter 202 in the classification network 200 may be a single classifier or a cascade of classifiers. Furthermore, each DNN detection classifier and filter 202 may further refine the box coordinates of the bounding box of the detected object. The confidence scores from all the DNN detection classifiers and filters 202 are fused at the fusion center 216. The modified bounding boxes from the different DNN detection classifiers and filters 202 may also be further fused into a single bounding box at the fusion center 216. Each network in the classification network 200 is trained independently. To train a secondary classification network, the primary object detector 210 is run on the training set to generate a set of object detections, and all object detections with a confidence score greater than a minimum value or a bounding box height greater than a minimum height are accepted. The primary detector will only output detections which are in accordance with the aspect ratios of its default bounding boxes, however the final aspect ratio may be slightly different due to adjustments of the detected box coordinates using box regression. An object detection is labeled as positive or negative according to the degree of its overlap with the ground truth as measured by the Jaccard overlap index. The object detections are rescaled and warped to a fixed size. Random crops of fixed size are obtained from the rescaled object detection boxes and provided with their label as input training samples to the classification network 200, where the label is determined to be positive if the intersection of the union ratio of the cropped box with a ground truth box has an overlap area greater than fifty percent. To further train a classification network 200, the positive object detections or crops around the ground truth box labels after appropriate translations back to the original image domain are expanded by a certain percentage, and the classification network 200 is trained to output the ground truth box coordinates through bounding box regression, where the ground truth box coordinates are translated back to the original image domain.

According to an embodiment of the present disclosure, the present system and method provides a fusion center 216 performing fusion via soft rejection. Soft rejection further refines the primary object detections by fusing them with the soft confidence results of different networks in the classification network 200. The present system and method includes fusion of localization bounding box adjustments at the fusion center 216. As an example, consider one primary candidate and one classification network 200. If the classification network 200 has determined a high confidence score in the candidate object (e.g., a confidence score that exceeds a given threshold score), the present system increases the original confidence score of the candidate object from the primary object detector 210 by multiplying the confidence score with a confidence scaling factor greater than one. Otherwise, the present system decreases the confidence score of the candidate object by a confidence scaling factor less than one. When testing the system, a set of classification probabilities are generated for each candidate object by processing the candidate object with all secondary networks in the classification network 200. Instead of using a binary classification with a probability threshold, the present system and method includes soft-rejection based on a score determined in the fusion center 216.

One advantage of the soft rejection method is that the present system does not directly accept or reject any candidate objects. Instead, the object confidence detection score is increased or decreased by scaling the confidence score with a factor based on the classification probabilities from the classification network 200. If one secondary classification network has determined a high confidence score for a candidate object, the respective confidence score is increased in the fusion center 216 by a confidence scaling factor greater than one. Otherwise, the confidence score is decreased in the fusion center 216 by a confidence scaling factor less than one. However, the confidence scaling factor is set to be at least p_min to prevent any secondary network from dominating the determination process, because an incorrect elimination of a positive object detection (such as may occur in a binary classification) cannot be corrected, whereas a low classification confidence score may be compensated by larger classification confidence scores from other secondary networks. Since the final score depends on the confidence scores of all secondary networks, even if one secondary network has low classification performance in one category (such as partially occluded pedestrians), the other secondary networks are able to compensate for its deficiency, thereby increasing the reliability of the system.

According to an embodiment of the present disclosure, a secondary classification network is confident if its softmax classification probability for a primary object detection exceeds a value p_max (for example, a probability of 0.7). Let $p_m$ be the probability generated by the $m_{th}$ secondary network for a candidate object, the confidence scaling factor $a_m$ may be determined by Equation (2) below:

$$a_m = p_m \times 1/p\_max \quad (2)$$

In order to fuse all M classification networks 200, the primary object confidence detection score P_primary from the primary object detector 210 is multiplied with the product of the m number of confidence scaling factors $a_m$ from all classification networks 200.

To prevent any secondary network from dominating the determination of the confidence score, or eliminating any object detection provided by the primary object detector 210, a lower bound of the final confidence scaling factor is set to be p_min (for example, a probability 0.1). The lower bound of the final fused confidence scaling factor $P\_fused_{classified}$ may be expressed as follows in Equation (3) below:

$$P\_fused_{classified} = P\_primary \times PRODUCT\_m(\max(a_m, p\_min)) \quad (3)$$

The final fused confidence scaling factor $P\_fused_{classified}$, expressed in Equation (3) above, is the product of all the m confidence scaling factors $a_m$ generated by the classification networks. However, if any of the confidence scaling factor is less than p_min, that particular confidence scaling factor is set to a value of p_min.

Figure 4:
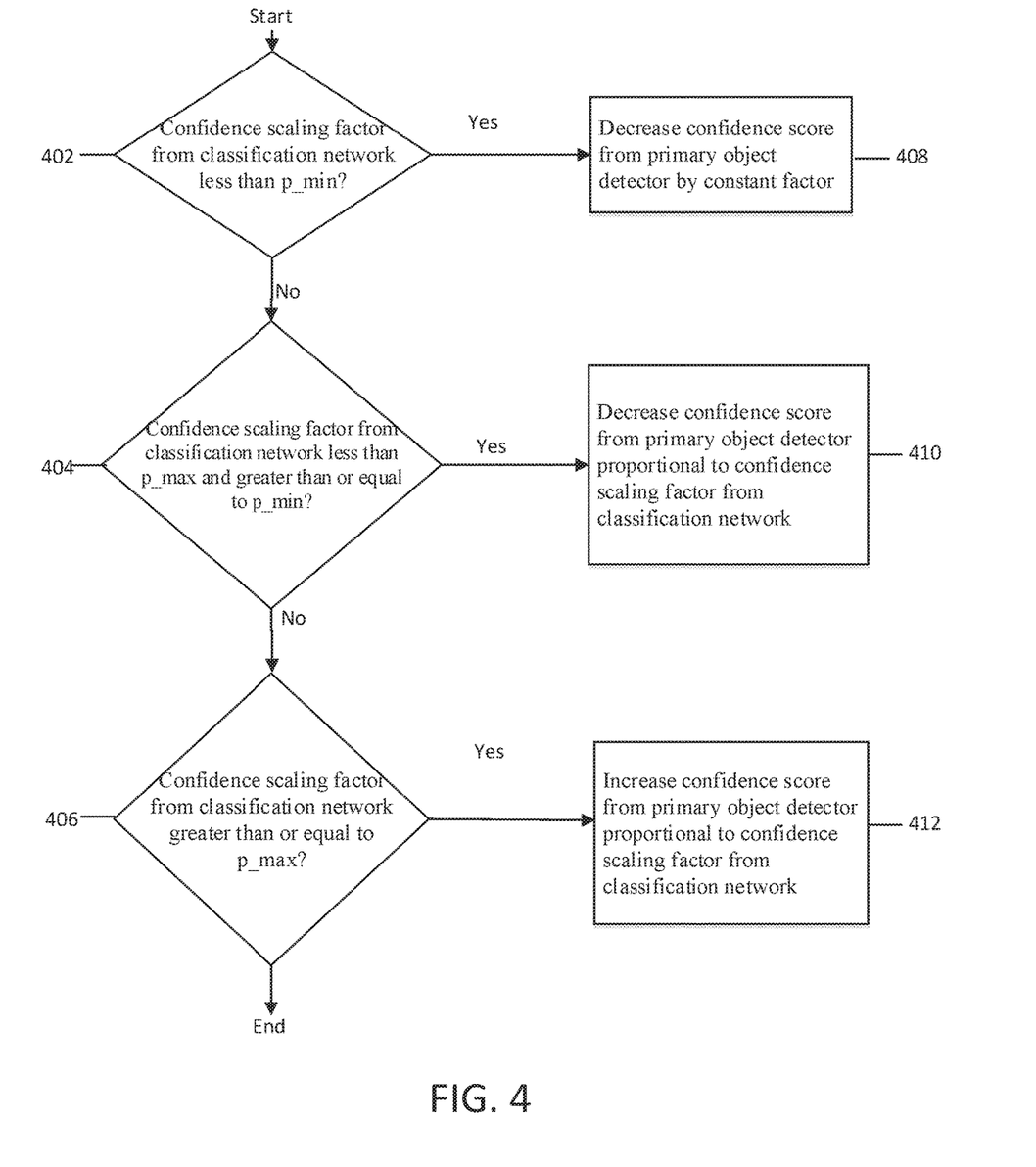
FIG. 4 illustrates a flow chart of a method of soft-rejection fusion of a primary object detection network with one classification network, according to an embodiment of the present disclosure.

FIG. 4 illustrates a flow chart of a method of soft-rejection fusion of a primary object detection network with one classification network, according to an embodiment of the present disclosure.

Referring to FIG. 4, the classification network 200 determines whether a confidence scaling factor from the classification network 200 is less than p_min at 402. If the confidence scaling factor is less than p_min, the fusion center 216 decreases a confidence score from the primary object detector 210 by a constant factor at 408. If the confidence scaling factor is not less than p_min, the classification network further determines whether the confidence scaling factor from the classification network 200 is less than p_max and greater than or equal to p_min at 404. If the confidence scaling factor from the classification network 200 is less than p_max and greater than or equal to p_min, the fusion center 216 decreases the confidence score from the primary object detector 210 proportional to the confidence scaling factor from the classification network 200 at 410. If the confidence score is not less than p_max and not greater than or equal to p_min, the classification network 200 determines whether the confidence scaling factor from the classification network 200 is greater than or equal to p_max. If the confidence scaling factor is not greater than or equal to p_max, the process ends. If the confidence scaling factor from the classification network 200 is greater than or equal to p_max, the fusion center 216 increases the confidence score from the primary object detector 210 proportional to the confidence scaling factor from the classification network 200 at 412.

The confidence scaling factor from the classification network 200 may be further modified according to the level of trust of each of the DNN neural network detection classifiers and filters 202 in the classification network 200. A trust metric, t_m may be determined which represents the level of trust associated with the classification network 200. The greater the value of t_m, the greater the trust level. The trust metric, or a scaled value of the trust metric, may be integrated in the fusion center 216 such that the classification provided by a classification network 200 with a larger trust metric t_m is given more importance as shown in Equation (4) below:

$$P\_fused_{classified} = P\_primary \times PRODUCT\_m(\max(a\_m \char`\^ t\_m, p\_min)) \quad (4)$$

The localization bounding boxes from the classification network 200 may also be fused at the fusion center, where the classification network 200 provides different values on the true box localization for the bounding box candidate output from the primary object detector 210. The offsets for the localization coordinates from the classification network 200 may be averaged and then applied to the localization coordinates of the bounding box from the primary object detector 210.

According to an embodiment of the present disclosure, the secondary object detector 212 of FIG. 2 is optional and determines how to fuse results from the classification network 200 with that of the primary object detector 210. The present soft-rejection fusion with the classification network 200 is slightly different from the present soft rejection fusion with a secondary object detector 212 as the secondary object detector 212 may generate new object detections which have not been provided by the primary object detector 210, which is not the case when the output of the classification network 200 is fused with the output of the primary object detector 210. To address the generation of new objects in the secondary object detector 212, the soft fusion method of the present disclosure eliminates new object detections by the secondary object detector 212, since they may contribute to increasing the false object detection rate. The secondary object detector 212 is only used to further fine-tune the primary object detector 210 primary confidence detection score. If the secondary confidence detection score from the secondary object detector 212 for an object detected by the primary object detector 210 exceeds a minimum threshold, the object detection is accepted and the primary confidence detection score is kept unaltered. Otherwise, soft-rejection fusion may be applied to scale the primary confidence detection score as shown in Equation (5) below:

If P_secondary>threshold, then P_fused$_{detect}$=P_primary; Otherwise, $$P\_fused_{detect}=P\_primary \times \max(P\_secondary \times (1/p\_max), p\_min)) \quad (5)$$

Equation (5) above may also be applied to the last P_fused obtained by fusion with the classification network 200, where P_primary is replaced by P_fused, as shown in Equation (6) below:

$$P\_fused_{detect}=P\_fused_{classified} \times \max(P\_secondary \times (1/p\_max), p\_min)) \quad (6)$$

The semantic segmentation unit 220 of FIG. 2 is also optional and determines how to use a pixel-wise semantic labeler to generate a confidence score in the detections of the primary object detector 210. The semantic segmentation unit 220 is based on deep dilated convolutions and context aggregation, and may be used as a parallel secondary object detector. To perform dense prediction, which is the task of predicting a label for each pixel in the captured image, the semantic segmentation unit 220 includes a fully convolutional VGG16 network, adapted with dilated convolutions as the front end prediction module, whose output is fed to a multi-scale context aggregation module that includes a fully convolutional network whose convolutional layers have increasing dilation factors. The semantic segmentation labeler extracts a soft metric for its confidence score in the primary object detector results. A captured image input to the semantic segmentation unit 212 is upscaled and directly processed by the semantic segmentation network. A binary mask is generated with one color showing the activated pixels for the pedestrian class, and the other color showing the background. The "person" and "rider" classification categories may be considered as pedestrians and the remaining classes may be considered as background. The semantic segmentation mask is overlapped with all detected bounding boxes from the primary object detector 210. According to an embodiment of the present disclosure, the present system and method fuses the semantic segmentation labeling and object detection results in the fusion center 216. The degree by which each primary object detection bounding box is colored by the semantic segmentation activation mask provides a measure of the confidence of the secondary semantic segmentation classification in the primary object detector's results. The threshold in Equation (5) above may be the minimum ratio of the area overlapped by the activated pixels identified as the pixels from the detected class by the semantic segmentation network, within each bounding box, to the area of the overlapping primary bounding box.

For example, if the activated pixels occupy at least 20% of the primary bounding box area, the object detection is accepted and the primary confidence detection score unaltered. Otherwise, soft-rejection fusion is applied to scale the primary confidence detection score from the primary object detector 210 as shown in Equation (7) below:

$$S_{all} = \begin{cases} S_{FDNN}, & \text{if } \frac{A_m}{A_b} > 0.2 \\ S_{FDNN} \times \max\left(\frac{A_m}{A_b} \times a_{ss}, b_{ss}\right), & \text{otherwise} \end{cases} \quad (7)$$

where $A_b$ represents the area of the bounding box and $A_m$ represents the area covered by semantic segmentation mask within detected bounded box $A7_{bbox} \cdot a_{ss}$, and $b_{ss}$ may be chosen as 4 and 0.35 respectively by cross validation.

Figure 5:
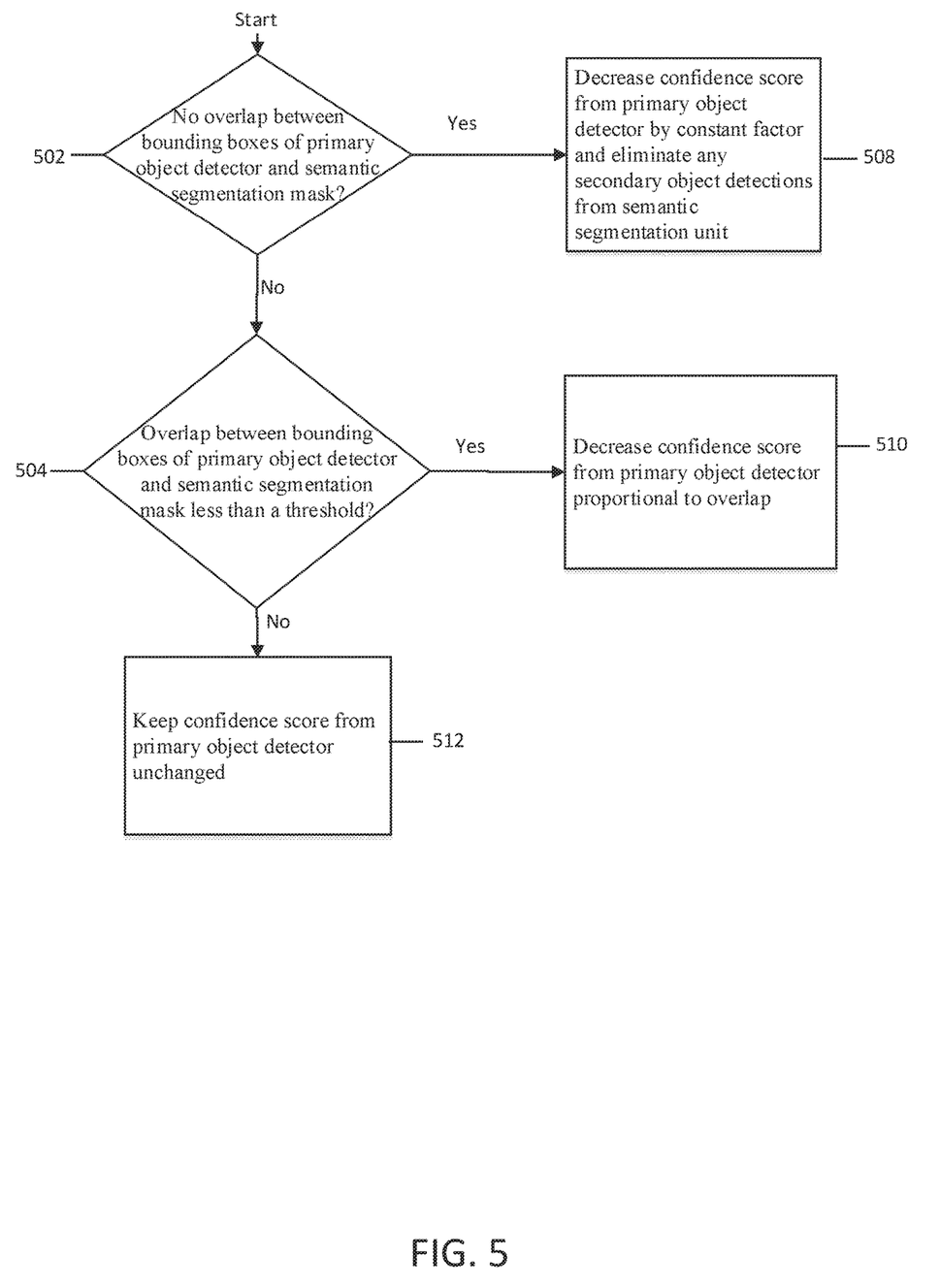
FIG. 5 illustrates a flow chart of a method of soft rejection fusion of a semantic segmentation labeler with a primary object detector, according to an embodiment of the present disclosure.

FIG. 5 is a flow chart of a soft rejection fusion method of a semantic segmentation labeler with a primary object detector, according to an embodiment of the present disclosure.

Referring to FIG. 5, the present system determines whether there is an overlap between the bounding boxes of a primary objector detector and a semantic segmentation mask at 502. If there is no overlap between the bounding boxes of the primary object detector and the semantic segmentation mask, the present system decreases the primary confidence detection score from the primary object detector by a constant factor and eliminates any secondary object detections from the semantic segmentation unit 220 at 508. Although the secondary object detections are eliminated due to non-overlap, the present system only adjusts the primary confidence detection score instead of setting the primary confidence detection score to zero, hence the primary confidence detection score is never eliminated. If there is an overlap between the bounding boxes of the primary object detector and the semantic segmentation mask, the present system determines whether the overlap between the bounding boxes of the primary object detector and the semantic segmentation mask is less than a threshold at 504. If the overlap between the bounding boxes of the primary object detector and the semantic segmentation mask is less than the threshold, the present system decreases the primary confidence detection score from the primary object detector in proportion to the amount of overlap at 510. Otherwise, at 512, the primary confidence detection score from the primary object detector is kept unchanged ensuring that the primary confidence detection score is never set to zero, even if any secondary confidence detection score may be zero. It is appreciated that the present system adjusts the primary confidence detection score based on the amount of overlap and may increase the primary confidence detection score if the amount of overlap is greater than a threshold, and/or reduce the primary confidence detection score if the amount of overlap is below a threshold, and/or reduce the primary confidence detection score if there is no overlap, or other variants without deviating from the scope of the present disclosure.

Figure 6A:
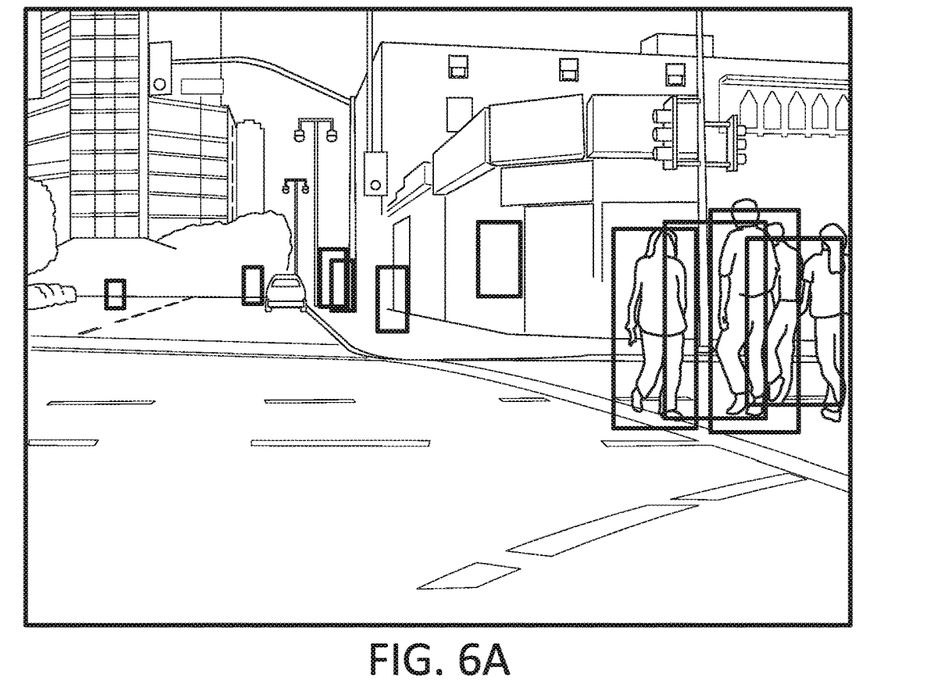
FIG. 6A illustrates a captured image with candidate objects, according to an embodiment of the present disclosure.
Figure 6B:
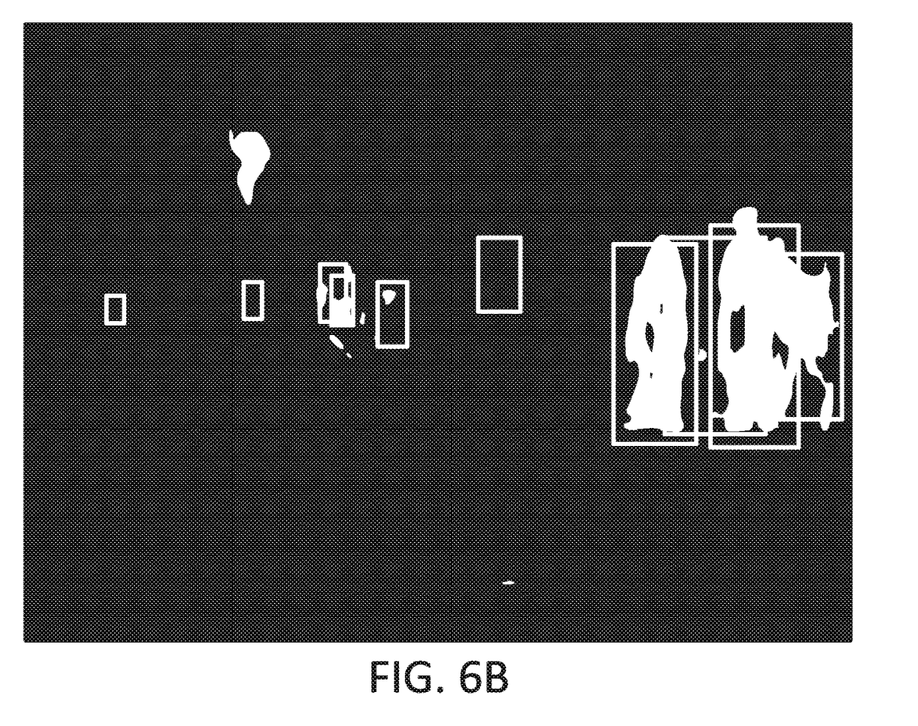
FIG. 6B illustrates a semantic segmentation mask of the captured image of FIG. 6A, according to an embodiment of the present disclosure.

FIG. 6A illustrates a captured image with candidate objects, according to an embodiment of the present disclosure. FIG. 6B illustrates a semantic segmentation mask of the captured image of FIG. 6A, according to an embodiment of the present disclosure.

Referring to FIGS. 6A and 6B, the semantic segmentation mask of FIG. 6B shows that false positive object detections may be eliminated from the primary object detector 210 since the false bounding boxes from the primary object detector 210 are not overlapped with the semantic segmentation mask. The semantic segmentation mask further shows the soft fusion by eliminating non-overlapping secondary object detection so that no additional false positive object detections are introduced. As shown in FIG. 6A, the candidate objects under consideration are pedestrians.

According to an embodiment of the present disclosure, the classification network 200 may be a secondary classification network only and not perform localization.

The soft fusion metric determined by the secondary object detector 212 may eliminate new object detections, or increase the primary confidence detection score from the primary object detector 210 by a constant factor if a confidence scaling factor exceeds a threshold, or if the confidence scaling factor is less than or equal to the threshold, the primary confidence detection score is kept unchanged.

According to an embodiment of the present disclosure, multiple localization metrics from the classification network 200 may be fused with the primary bounding box candidate by non-maximum suppression instead of averaging of the secondary coordinate offsets, or both averaging and non-maximum suppression methods may be used together.

According to an embodiment of the present disclosure, the primary object detector 210 may include a semantic segmentation labeler, and the secondary object detector 212 may help improve the semantic segmentation labeler in the primary object detector 210 to identify multiple instances of the same class.

The present system and method provides soft rejection fusion by increasing or decreasing the confidence score of objects detected in a captured image by scaling the primary confidence detection score from the primary object detector by a factor based on the classification probabilities measured as confidence scores from the classification network. Soft rejection fusion prevents any classification network from dominating the decision process, and prevents elimination of a primary candidate object detection based on a single metric from any classification network. Soft rejection fusion supports correction of an error of one DNN detection classifier and filter by that of another DNN detection classifier and filter, and accumulates intelligence from multiple classification networks. Soft rejection fusion is not sensitive to the order of the fusion of the primary object detector results with the classification network results.

The present network fusion architecture supports operation of a secondary object detector with a primary object detector in parallel to decrease latency. The present network fusion architecture supports operation of multiple deep neural network classifiers and filters in the classification network in parallel to decrease latency. The present system and method provides training of classification networks.

Figure 7:
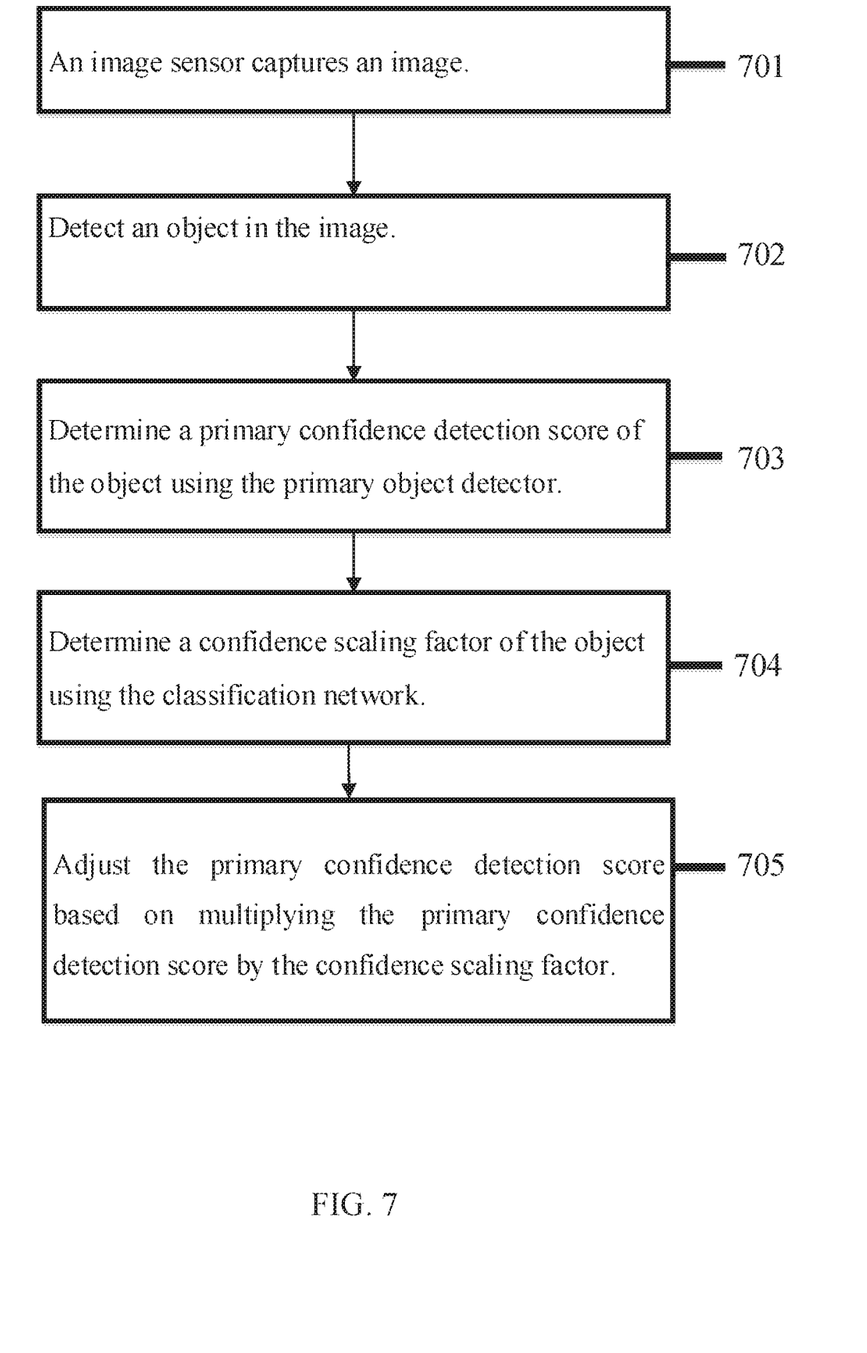
FIG. 7 illustrates a flowchart of a method of detecting objects in an image, according to an embodiment of the present disclosure.

FIG. 7 is a flowchart of a method of detecting objects in an image, according to an embodiment of the present disclosure.

Referring to FIG. 7, the present system, at 701, captures an image using an image sensor. At 702, a primary object detector detects an object in the image and determines a bounding box of the detected object. At 703, the primary object detector determines a primary confidence detection score of the object. At 704, a confidence scaling factor of the object is determined using the classification network. At 705, the primary confidence detection score is adjusted based on multiplying the primary confidence detection score by the confidence scaling factor.

Figure 8:
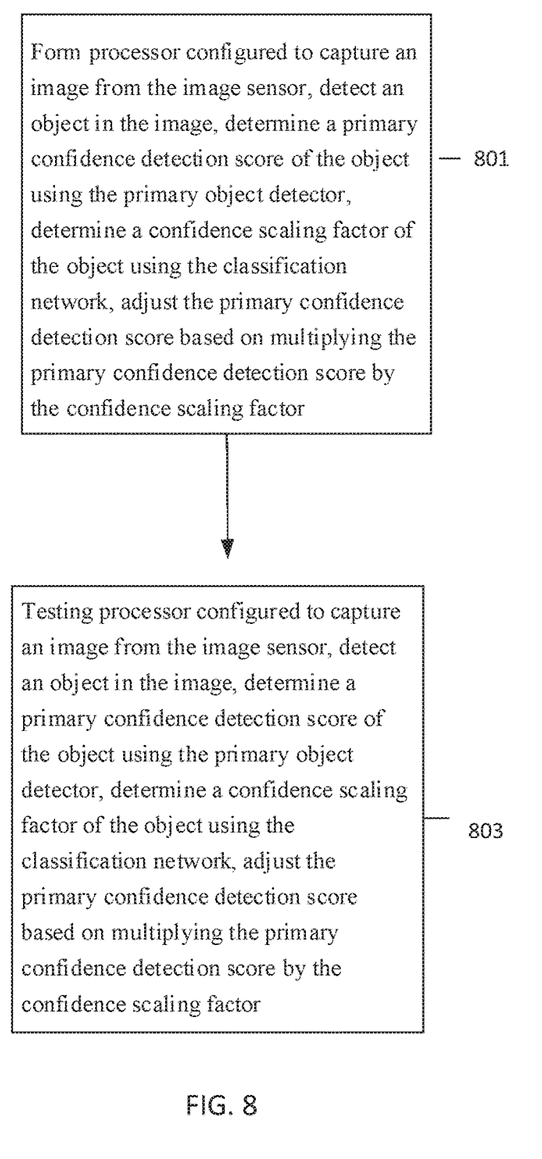
FIG. 8 illustrates a flowchart of a method of testing a processor configured to detect objects in an image, according to an embodiment of the present disclosure.

FIG. 8 illustrates a flowchart of a method of testing a processor configured to detect objects in an image, according to an embodiment of the present disclosure. The processor can be implemented in hardware or implemented in hardware that is programmed with software.

Referring to FIG. 8, the method, at 801, forms the processor as part of a wafer or package that includes at least one other processor. The processor is configured to capture an image from the image sensor, detect an object in the image, determine a primary confidence detection score of the object using the primary object detector, determine a confidence scaling factor of the object using the classification network, adjust the primary confidence detection score based on multiplying the primary confidence detection score by the confidence scaling factor.

At 803, the method tests the processor. Testing the processor includes testing the processor and the at least one other processor using one or more electrical to optical converters, one or more optical splitters that split an optical signal into two or more optical signals, and one or more optical to electrical converters.

Figure 9:
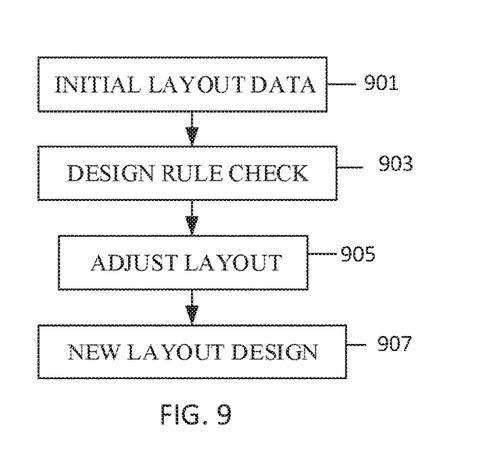
FIG. 9 illustrates a flowchart of a method of manufacturing a processor configured to detect objects in an image, according to an embodiment of the present disclosure.

FIG. 9 illustrates a flowchart of a method of manufacturing a processor configured to detect objects in an image, according to an embodiment of the present disclosure.

Referring to FIG. 9, the method, at 901, includes an initial layout of data in which the method generates a mask layout for a set of features for a layer of an integrated circuit. The mask layout includes standard cell library macros for one or more circuit features that include a processor. The processor is configured to capture an image from the image sensor, detect an object in the image, determine a primary confidence detection score of the object using the primary object detector, determine a confidence scaling factor of the object using the classification network, adjust the primary confidence detection score based on multiplying the primary confidence detection score by the confidence scaling factor.

At 903, there is a design rule check in which the method disregards relative positions of the macros for compliance to layout design rules during the generation of the mask layout.

At 905, there is an adjustment of the layout in which the method checks the relative positions of the macros for compliance to layout design rules after generating the mask layout.

At 907, a new layout design is made, in which the method, upon detection of noncompliance with the layout design rules by any of the macros, modifies the mask layout by modifying each of the noncompliant macros to comply with the layout design rules, generates a mask according to the modified mask layout with the set of features for the layer of the integrated circuit and manufactures the integrated circuit layer according to the mask.

While the present disclosure has been particularly shown and described with reference to certain embodiments thereof, it will be understood by those of ordinary skill in the art that various changes in form and details may be made therein without departing from the scope of the present disclosure as defined by the appended claims and their equivalents.

What is claimed is:

1. A method, comprising:
receiving an image;
detecting an object in the image;
determining, by a primary object detector, a primary confidence detection score of the object;
determining, by a classification network, a confidence scaling factor of the object;
adjusting the primary confidence detection score based on multiplying the primary confidence detection score by the confidence scaling factor;
generating a semantic segmentation mask based on classifying each pixel into one of pre-determined classes;
determining an amount of overlap, if any, between a bounding box of the object and the semantic segmentation mask; and
adjusting the primary confidence detection score and eliminating a secondary object detection from the semantic segmentation mask if there is no overlap between the bounding box of the object and the semantic segmentation mask,
wherein the semantic segmentation mask is a binary mask generated with one color showing activated pixels in the image and another color showing a background in the image.

2. The method of claim 1, further comprising:
scaling the primary confidence detection score based on multiplying the primary confidence detection score by a product of a plurality of confidence scaling factors of the object from a plurality of classification networks.

3. The method of claim 2, further comprising:
setting an object detection to a fixed size using the scaled primary confidence detection score;
determining random crops with the fixed size from the scaled primary confidence detection score; and
labelling a class of the random crops with respect to ground truth to train the classification network.

4. The method of claim 1, wherein the confidence scaling factor is based on a ratio of a classification probability of the object to a desired maximum classification probability.

5. The method of claim 1, wherein the confidence scaling factor is set to at least a desired minimum value.

6. The method of claim 1, further comprising determining a secondary confidence detection score of the object;
maintaining the primary confidence detection score if the secondary confidence detection score is greater than or equal to a threshold; and
adjusting the primary confidence detection score if the secondary confidence detection score is less than the threshold.

7. The method of claim 6, wherein adjusting the primary confidence detection score if the secondary confidence detection score is less than the threshold comprises multiplying the primary confidence detection score by a product of the secondary confidence detection score and a plurality of confidence scaling factors.

8. The method of claim 6, wherein adjusting the primary confidence detection score if the secondary confidence detection score is less than the threshold comprises multiplying the adjusted primary confidence detection score by a product of the secondary confidence detection score and a plurality of confidence scaling factors.

9. The method of claim 1, further comprising adjusting the primary confidence detection score in proportion to an amount of overlap if the amount of overlap between a bounding box of the object and a semantic segmentation mask is less than a threshold.

10. The method of claim 1, further comprising maintaining the primary confidence detection score if an amount of overlap between a bounding box of the object and a semantic segmentation mask is greater than or equal to a threshold.

11. The method of claim 1, further comprising operating the primary object detector and the classification network in parallel.

12. An apparatus, comprising:
an image sensor;
a primary object detector;
a classification network; and
a processor configured to:
capture an image from the image sensor,
detect an object in the image,
determine a primary confidence detection score of the object using the primary object detector,
determine a confidence scaling factor of the object using the classification network,
adjust the primary confidence detection score based on multiplying the primary confidence detection score by the confidence scaling factor,
generate a semantic segmentation mask based on classifying each pixel into one of pre-determined classes,
determine an amount of overlap, if any, between a bounding box of the object and the semantic segmentation mask; and
adjust the primary confidence detection score and eliminate a secondary object detection from the semantic segmentation mask if there is no overlap between the bounding box of the object and the semantic segmentation mask,
wherein the semantic segmentation mask is a binary mask generated with one color showing activated pixels in the image and another color showing a background in the image.

13. The apparatus of claim 12, wherein the processor is further configured to scale the primary confidence detection score based on multiplying the primary confidence detection score by a product of a plurality of confidence scaling factors of the object from a plurality of classification networks.

14. The apparatus of claim 12, wherein the confidence scaling factor is based on a ratio of a classification probability of the object to a desired maximum classification probability.

15. The apparatus of claim 12, wherein the confidence scaling factor is set to at least a desired minimum value.

16. The apparatus of claim 12, wherein the processor is further configured to determine a secondary confidence detection score of the object,
maintain the primary confidence detection score if the secondary confidence detection score is greater than or equal to a threshold, and
adjust the primary confidence detection score if the secondary confidence detection score is less than the threshold.

17. The apparatus of claim 16, wherein adjusting the primary confidence detection score if the secondary confidence detection score is less than the threshold comprises multiplying the primary confidence detection score by a product of the secondary confidence detection score and a plurality of confidence scaling factors.

18. The apparatus of claim 16, wherein adjusting the primary confidence detection score if the secondary confidence detection score is less than the threshold comprises multiplying the adjusted primary confidence detection score by a product of the secondary confidence detection score and a plurality of confidence scaling factors.

19. The apparatus of claim 12, wherein the processor is further configured to adjust the primary confidence detection score in proportion to an amount of overlap if the amount of overlap between a bounding box of the object and a semantic segmentation mask is less than a threshold.

20. The apparatus of claim 12, wherein the processor is further configured to maintain the primary confidence detection score if an amount of overlap between a bounding box of the object and a semantic segmentation mask is greater than or equal to a threshold.

21. The apparatus of claim 12, wherein the processor is further configured to operate the primary object detector and the classification network in parallel.

22. The apparatus of claim 12, wherein the processor is further configured to:
set an object detection to a fixed size using the scaled primary confidence detection score,
determine random crops with the fixed size from the scaled primary confidence detection score, and
label a class of the random crops with respect to ground truth to train the classification network.

23. A method of manufacturing a processor, comprising:
forming the processor as part of a wafer or package that includes at least one other processor, wherein the processor is configured to capture an image from an image sensor, detect an object in the image, determine a primary confidence detection score of the object using a primary object detector, determine a confidence scaling factor of the object using a classification network, adjust the primary confidence detection score based on multiplying the primary confidence detection score by the confidence scaling factor, generate a semantic segmentation mask based on classifying each pixel into one of pre-determined classes, determine an amount of overlap, if any, between a bounding box of the object and the semantic segmentation mask, and adjust the primary confidence detection score and eliminate a secondary object detection from the semantic segmentation mask if there is no overlap between the bounding box of the object and the semantic segmentation mask, wherein the semantic segmentation mask is a binary mask generated with one color showing activated pixels in the image and another color showing a background in the image.

24. A method of constructing an integrated circuit, comprising:
generating a mask layout for a set of features for a layer of the integrated circuit, wherein the mask layout includes standard cell library macros for one or more circuit features that include a processor configured to capture an image from a image sensor, detect an object in the image, determine a primary confidence detection score of the object using a primary object detector, determine a confidence scaling factor of the object using a classification network, adjust the primary confidence detection score based on multiplying the primary confidence detection score by the confidence scaling factor, generate a semantic segmentation mask based on classifying each pixel into one of pre-determined classes, determine an amount of overlap, if any, between a bounding box of the object and the semantic segmentation mask, and adjust the primary confidence detection score and eliminate a secondary object detection from the semantic segmentation mask if there is no overlap between the bounding box of the object and the semantic segmentation mask, wherein the semantic segmentation mask is a binary mask generated with one color showing activated pixels in the image and another color showing a background in the image.

* * * * *